(12) United States Patent
Chen

(10) Patent No.: US 8,445,849 B2
(45) Date of Patent: May 21, 2013

(54) IR SENSING DEVICE

(75) Inventor: Hui-Hsuan Chen, Hsin-Chu (TW)

(73) Assignee: PixArt Imaging Inc., Science-Based Industrial Park, Hsin-Chu (TW)

( * ) Notice: Subject to any disclaimer, the term of this patent is extended or adjusted under 35 U.S.C. 154(b) by 802 days.

(21) Appl. No.: 12/582,713

(22) Filed: Oct. 21, 2009

(65) Prior Publication Data

US 2010/0237247 A1 Sep. 23, 2010

Related U.S. Application Data

(60) Provisional application No. 61/161,077, filed on Mar. 18, 2009.

(51) Int. Cl.
*G01J 5/02* (2006.01)
*G01J 3/50* (2006.01)

(52) U.S. Cl.
USPC ........................ 250/339.05; 250/226

(58) Field of Classification Search
USPC ............... 250/339.05, 339.02, 208.3, 370.08, 250/226
See application file for complete search history.

(56) References Cited

U.S. PATENT DOCUMENTS

| | | | |
|---|---|---|---|
| 5,648,653 A * | 7/1997 | Sakamoto et al. | 250/208.1 |
| 6,125,197 A | 9/2000 | Mack | |
| 6,211,521 B1 | 4/2001 | Bawolek | |
| 6,292,212 B1 | 9/2001 | Zigadlo | |
| 6,825,470 B1 | 11/2004 | Bawolek | |
| 2006/0261280 A1* | 11/2006 | Oon et al. | 250/370.08 |
| 2007/0252908 A1 | 11/2007 | Kolehmainen | |
| 2009/0236960 A1 | 9/2009 | Van Grootel | |

FOREIGN PATENT DOCUMENTS

| | | |
|---|---|---|
| CN | 101015035 A | 8/2007 |
| CN | 101036380 A | 9/2007 |

* cited by examiner

*Primary Examiner* — David Porta
*Assistant Examiner* — Faye Boosalis
(74) *Attorney, Agent, or Firm* — Winston Hsu; Scott Margo

(57) ABSTRACT

An Infrared Radiation (IR) sensing device comprises a lens module, an IR pass filter, and an optical sensor. The lens module is utilized for focusing light. The IR pass filter comprises an optical coating, and a Color Filter Array (CFA) module. The optical coating is utilized for blocking light with wavelength around a predetermined range. The CFA module is utilized for blocking light with wavelength around 400 nm to 780 nm. The optical sensor for absorbing photons of light after being blocked by the IR pass filter on the optical path and accordingly generating an electrical signal. With the help of the CFAs, the range of the wavelength that the optical coating has to block becomes smaller, which greatly reduces the required number of layers of the optical coating.

25 Claims, 18 Drawing Sheets

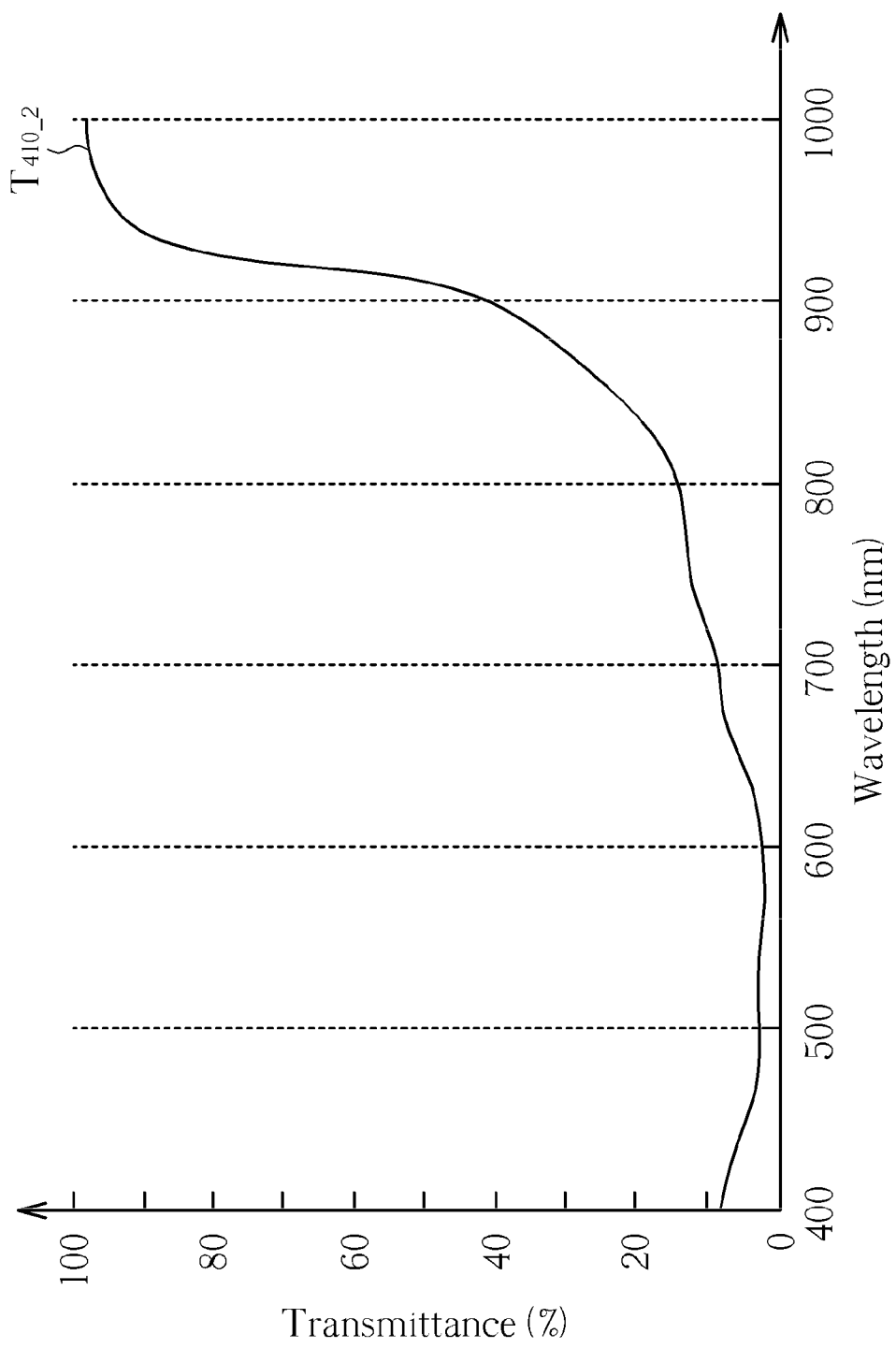

IR SENSING DEVICE

CROSS REFERENCE TO RELATED APPLICATIONS

This application claims the benefit of U.S. Provisional Application No. 61/161,077, filed on Mar. 18, 2009 and entitled "Infrared pass filter" the contents of which are incorporated herein.

BACKGROUND OF THE INVENTION

1. Field of the Invention

The present invention relates to an Infrared Radiation (IR) sensing device, and more particularly, to an IR sensing device by means of overlaying one or more Color Filter Arrays (CFA) along with the optical coating for passing IR and filtering non-IR out.

2. Description of the Prior Art

IR sensing devices based on silicon technology typically require the use of a non-infrared blocking element somewhere in the optical chain for only responding IR. The purpose of this element is to prevent non-infrared radiation (IR) or light (typically considered to be light with a wavelength longer than 780 nm) from entering the optical sensors of the optical sensing devices. Silicon-based optical sensors, e.g. Charge Coupled Device (CCD) sensor or a Complementary Metal-Oxide-Semiconductor (CMOS) sensor, will typically be sensitive to light with wavelengths up to approximately 1000 nm. If the non-IR (visible light) is permitted to enter the optical sensor, the IR sensing device will respond to the non-IR, and generate an output signal. Since the purpose of the IR sensing device is to create a representation of IR present in a scene, the non-IR will introduce a false response.

A common method for preventing these difficulties is to use a thin-film optical coating on glass to create an optical element which blocks visible light (typically from 400 nm to 780 nm) and passes the IR. However, to block light with such wide range (400 nm to 780 nm), the number of the layers of the optical coating is larger, e.g. 45. Since the number of the layers of the optical coating has to be so large to achieve the capability of filtering out the non-IR, which deteriorates the malleability and the flexibility of the optical coating, the optical coating can not be coated on the lens nor the optical sensor consequently. Therefore, the conventional IR sensing device realized with the optical coating comes with high cost and difficulty for production, which is inconvenient.

SUMMARY OF THE INVENTION

The present invention provides an Infrared Radiation (IR) sensing device. An optical path exists for an ambient light to enter the IR sensing device. The IR sensing device comprises a lens module, an IR pass filter, and an optical sensor. The lens module is disposed on the optical path. The lens module is utilized for focusing light on the optical path. The IR pass filter comprises an optical coating, and a Color Filter Array (CFA) module. The optical coating is disposed on the optical path. The optical coating is utilized for blocking light with wavelength around a predetermined range. The CFA module is disposed on the optical path. The CFA module is utilized for blocking light with wavelength around 400 nm to 780 nm. The optical sensor for absorbing photons of light after being blocked by the IR pass filter on the optical path and accordingly generating an electrical signal.

The present invention further provides a two-band pass sensing device. An optical path exists for an ambient light to enter the two-band pass sensing device. The two-band pass sensing device comprises a lens module, a two band-pass filter, and an optical sensor. The lens module is disposed on the optical path for focusing light on the optical path. The two band-pass filter comprises a CFA module. The CFA module is disposed on the optical path. The CFA module comprises a blue CFA and a green CFA. The blue CFA is utilized for passing blue light. The green CFA is utilized for passing green light. The optical sensor is utilized for absorbing photons of light after being blocked by the IR pass filter on the optical path and accordingly generating an electrical signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6(b) is a diagram illustrating the resulting transmittance spectrum of the IR pass filter of the present invention from FIG. 6(a).

DETAILED DESCRIPTION

Figure 1:
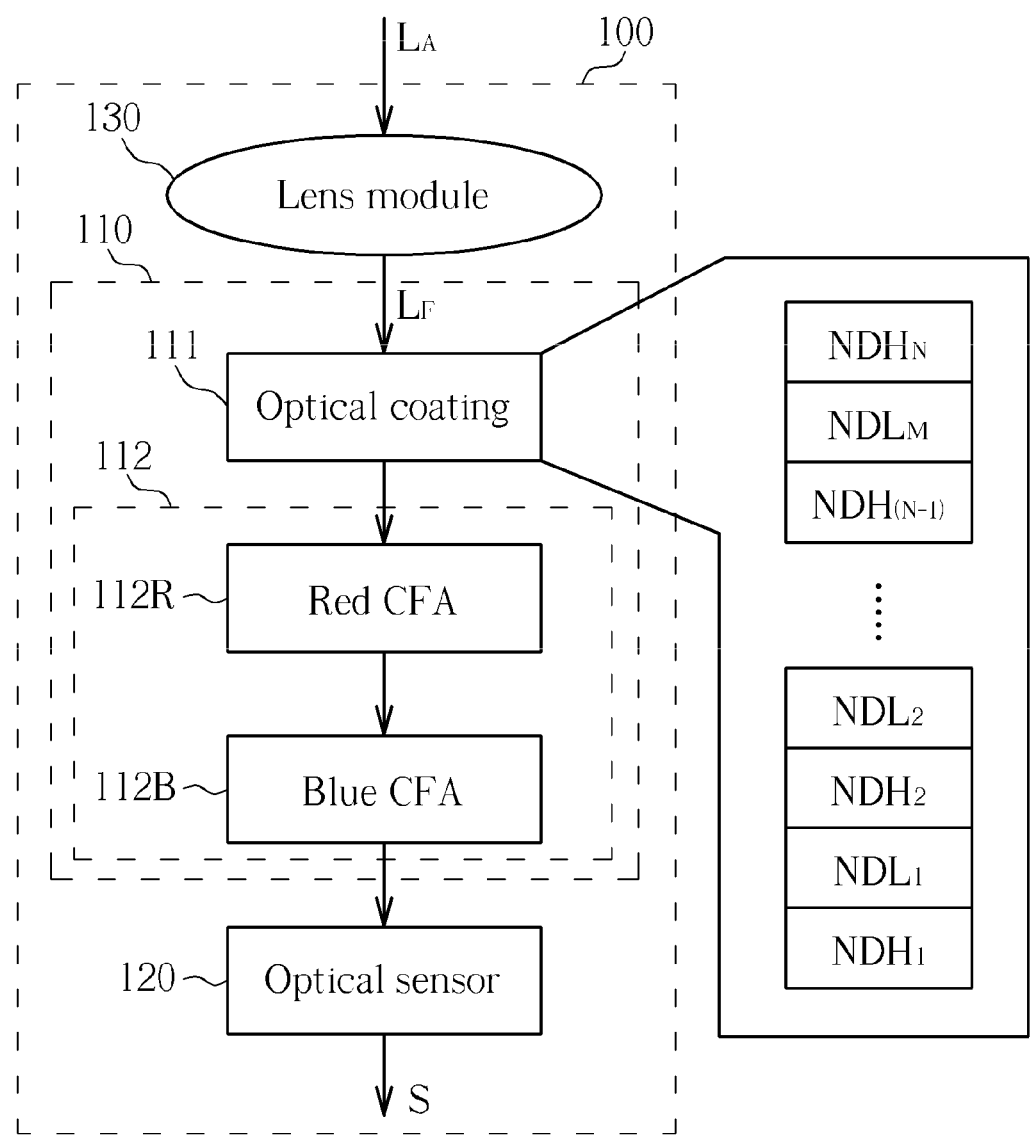
FIG. 1 is a diagram illustrating an IR sensing device according to a first embodiment of the present invention.

Please refer to FIG. 1. FIG. 1 is a diagram illustrating an IR sensing device 100 according to a first embodiment of the present invention. The IR sensing device 100 comprises an IR pass filter 110, an optical sensor 120, and a lens module 130. An optical path exists on the IR sensing device 100 for allowing an ambient light $L_A$ to enter the optical sensor 120.

The lens module 130, disposed on the optical path, provides a focused light $L_F$ out of an ambient light $L_A$ from a scene. That is, the lens module 130 focuses the ambient light $L_A$ to be the focused light $L_F$. The optical sensor 120, disposed on the optical path, may comprise a photo diode, where photons absorbed by the photo diode generate an electrical signal S, either a voltage or current signal, indicative of the number of photons absorbed by the photo diode.

The IR pass filter 110, disposed on the optical path, comprises an optical coating 111, and a CFA module 112. The CFA module 112 comprises a red and a blue CFAs 112R and 112B. The red CFA 112R mainly blocks light with the wavelength around 400 nm to 570 nm, and the blue CFA 112B mainly blocks light with the wavelength around 520 nm to 780 nm.

The optical coating 111, disposed on the optical path, is formed by interlacingly stacking/overlaying N high refractive index layers $NDH_1 \sim NDH_N$ (for example, $TiO_2$) and M low refractive index layers $NDL_1 \sim NDL_M$ (for example, $MgF_2$ or $SiO_2$), wherein M and N represent integer around 3, respectively (in FIG. 1, N is determined to be equal to (M+1) for example). By means of the interference effect, the transmittance spectrum of the optical coating 111 is set according to the thicknesses, the materials, or the number of the high index layers $NDH_1 \sim NDH_N$ and the low refractive index layers $NDL_1 \sim NDL_M$ and can be adjusted by above-mentioned factors. Since the light with the wavelengths 400 nm to 570 nm and 520 nm to 780 nm are respectively blocked by the red CFA 112R and the blue CFA 112B, the optical coating 111 has only to block light with the wavelength around 900 nm to 1000 nm, which is a much smaller range, and consequently the number of the layers of the optical coating 111 can be greatly reduced, for example, can be reduced to 7.

Figure 2A:
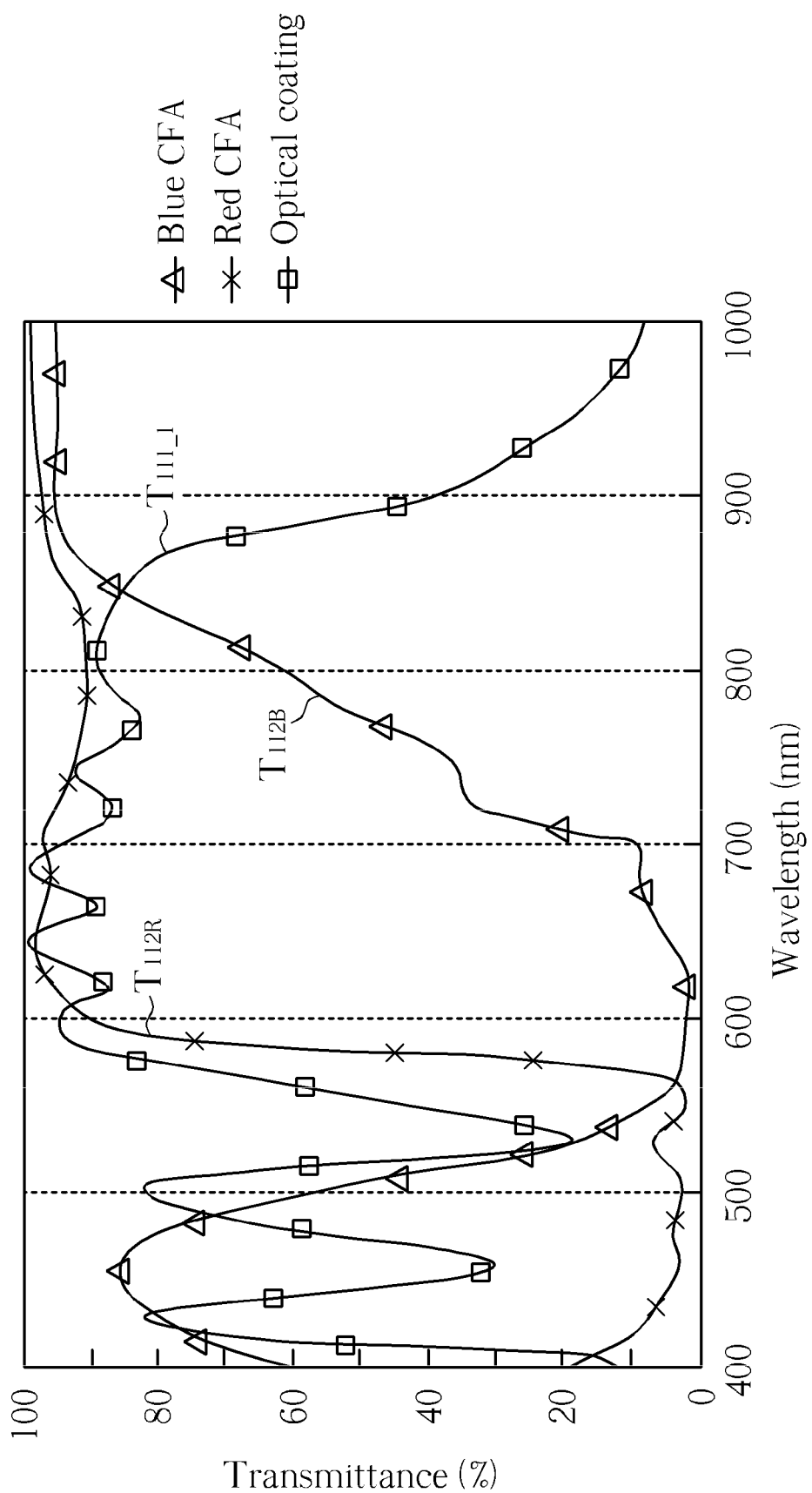
FIG. 2(a) is a diagram illustrating the transmittance spectrums respectively of the optical coating with a first setting, the red and the blue CFAs of the present invention.
Figure 2B:
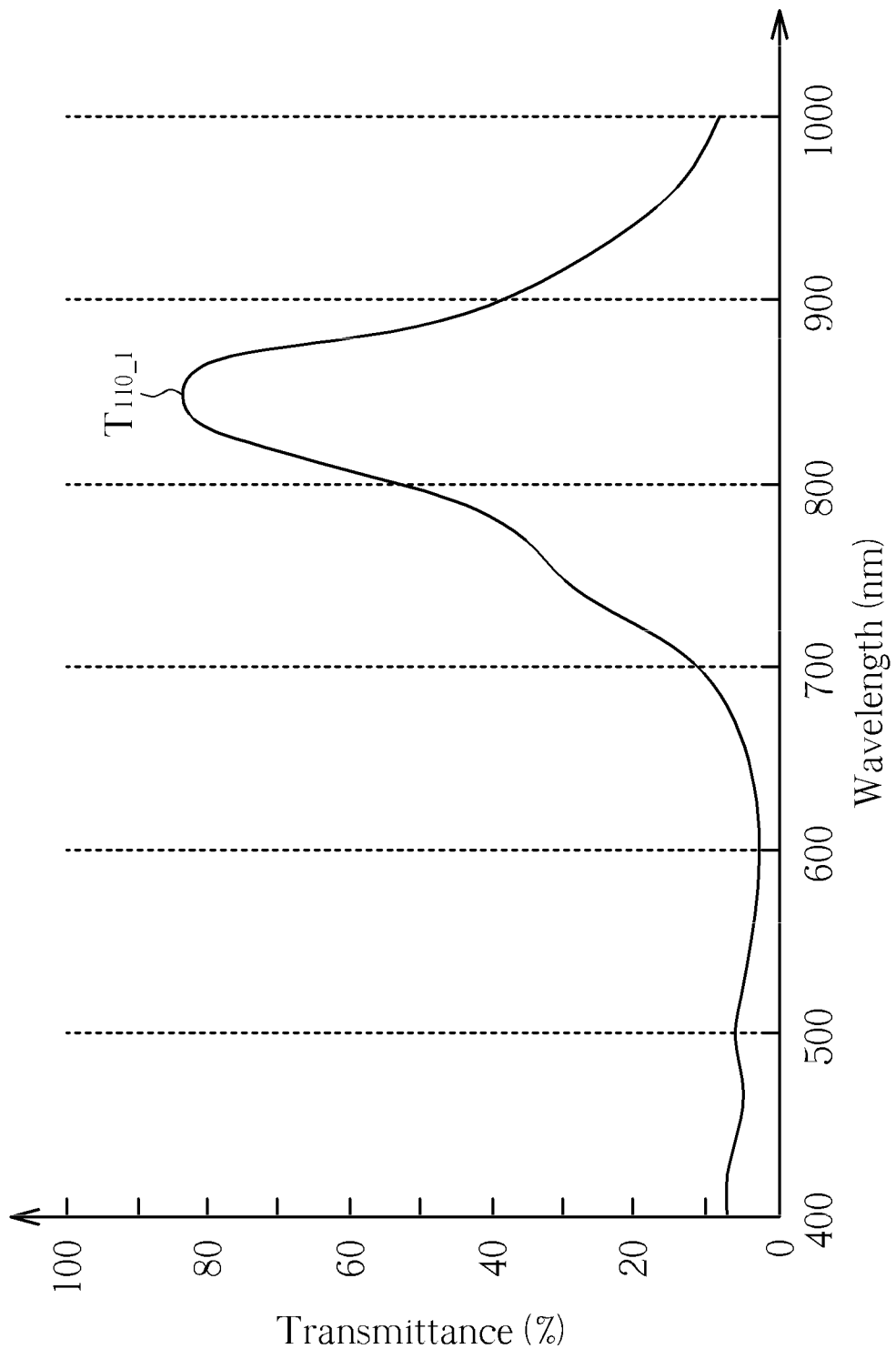
FIG. 2(b) is a diagram illustrating the resulting transmittance spectrum of the IR pass filter of the present invention from FIG. 2(a).

Please refer to FIG. 2. FIG. 2(a) is a diagram illustrating the transmittance spectrums $T_{111\_1}$, $T_{112R}$, and $T_{112B}$ respectively of the optical coating 111 with a first setting, the red CFA 112R, and the blue CFA 112B of the present invention. FIG. 2(b) is a diagram illustrating the resulting transmittance spectrum $T_{110\_1}$ of the IR pass filter 110 of the present invention from FIG. 2(a). As shown in FIG. 2(a), in the sensitive range for the optical sensor 120, the red CFA 112R is only transparent to red light and IR; the blue CFA 112B is only transparent to blue light and IR. In the infrared range, the optical coating 111 has a low transmittance (opaque) around the wavelength from 900 nm to 1000 nm. By combining the transmittance spectrums $T_{111\_1}$, $T_{112R}$, and $T_{112B}$, the transmittance spectrum $T_{110\_1}$ of the IR pass filter 110 is obtained. As shown in FIG. 2(b), the IR pass filter 110 is only transparent from 780 nm to 900 nm between the sensitive range for the optical sensor 120. Therefore, the IR sensing device 100 senses the light emitted from a Light-Emitting Diode (LED) of 850 nm type.

Figure 3A:
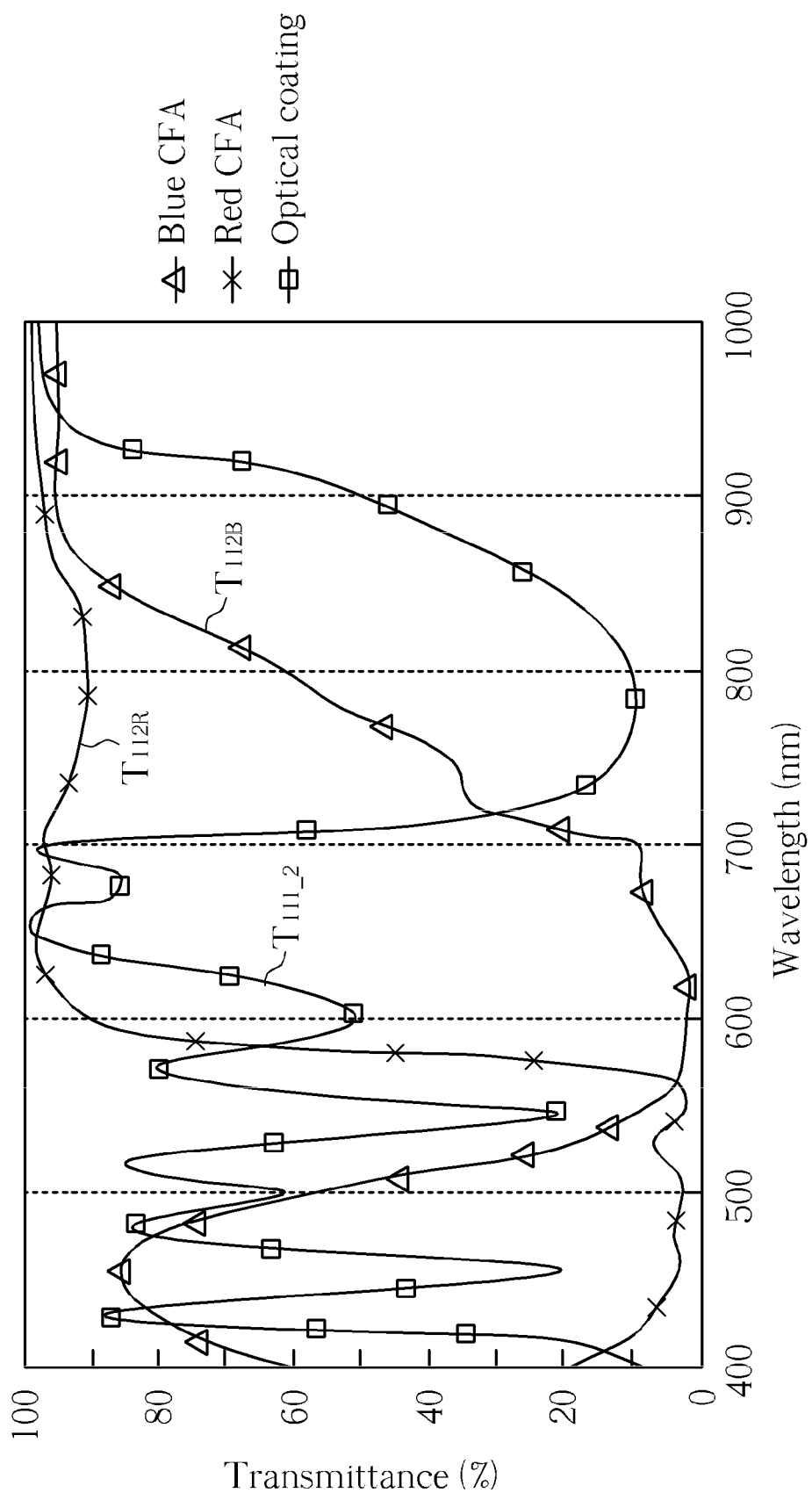
FIG. 3(a) is a diagram illustrating the transmittance spectrums respectively of the optical coating with a second setting, the red and the blue CFAs of the present invention.
Figure 3B:
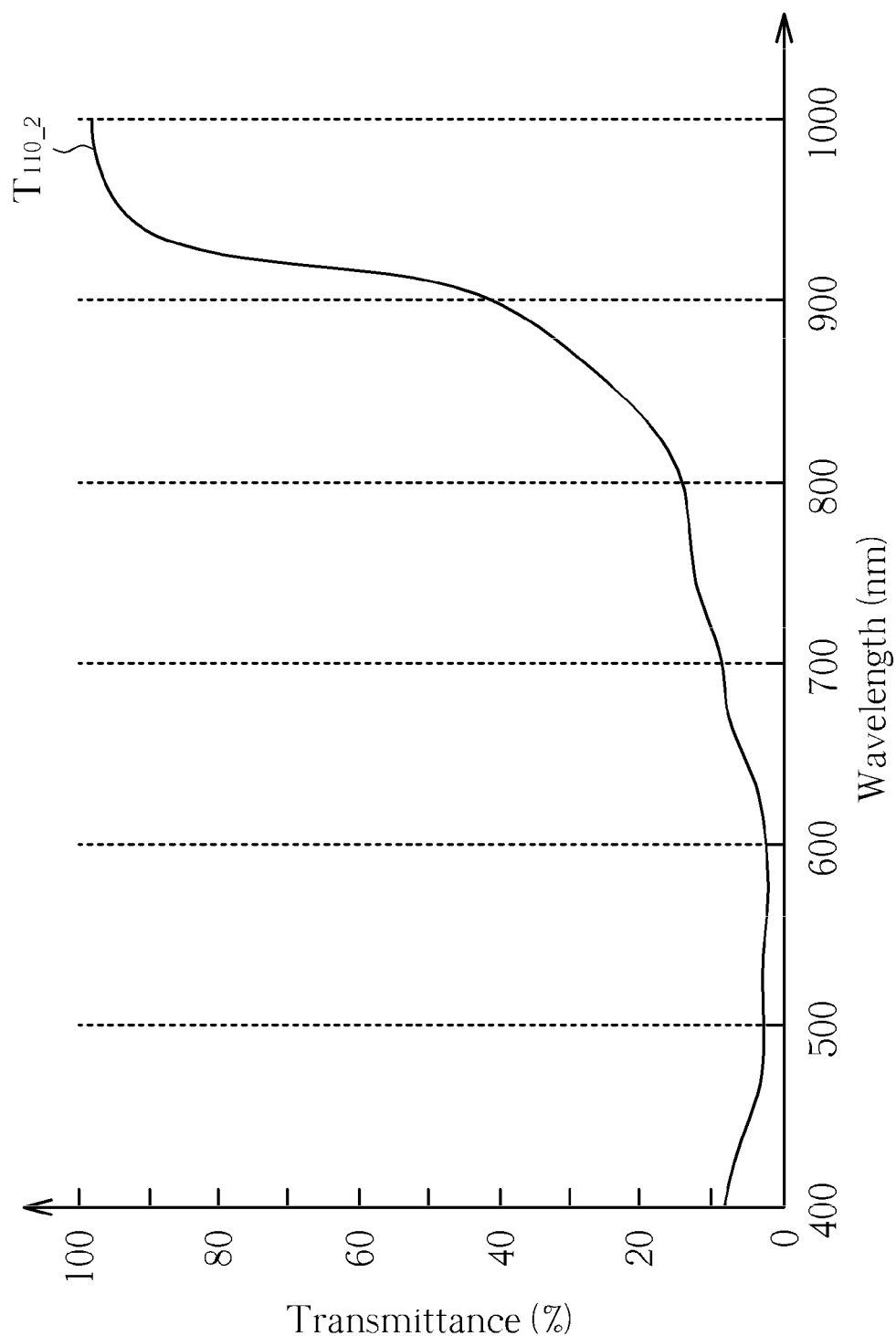
FIG. 3(b) is a diagram illustrating the resulting transmittance spectrum of the IR pass filter of the present invention from FIG. 3(a).

Please refer to FIG. 3. FIG. 3(a) is a diagram illustrating the transmittance spectrums $T_{111\_2}$, $T_{112R}$, $T_{112B}$ respectively of the optical coating 111 with a second setting, the red CFA 112R, and the blue CFA 112B of the present invention. FIG. 3(b) is a diagram illustrating the resulting transmittance spectrum $T_{110\_2}$ of the IR pass filter 110 of the present invention from FIG. 3(a). The transmittance spectrum $T_{111\_2}$ is different from of the transmittance spectrum $T_{111\_1}$ by means of changing the thicknesses, the materials, or the number of the high index layers $NDH_1 \sim NDH_N$ and the low refractive index layers $NDL_1 \sim NDL_M$. Therefore, in FIG. 3(a), the optical coating 111 with the second setting has a low transmittance (opaque) around the wavelength from 750 nm to 880 nm in the infrared range. By combining the transmittance spectrums $T_{111\_2}$, $T_{112R}$, and $T_{112B}$, another transmittance spectrum $T_{110\_2}$ of the IR pass filter 110 is obtained. As shown in FIG. 3(b), the IR pass filter 110 is only transparent around from 900 nm to 1000 nm between the sensitive range for the optical sensor 120. Therefore, the IR sensing device 100 senses the light emitted from an LED of 940 nm type.

Since the number of the layers of the red CFA 112R and the blue CFA 112B are 2, and the number of the layers of the optical coating 111 is around 7, the number of the overall layers of the IR pass filter 110 is greatly reduced. Furthermore, the CFA module 112 is easily integrated with the optical sensor 120, which reduces cost for the IR sensing device 200 of the present invention.

Figure 4:
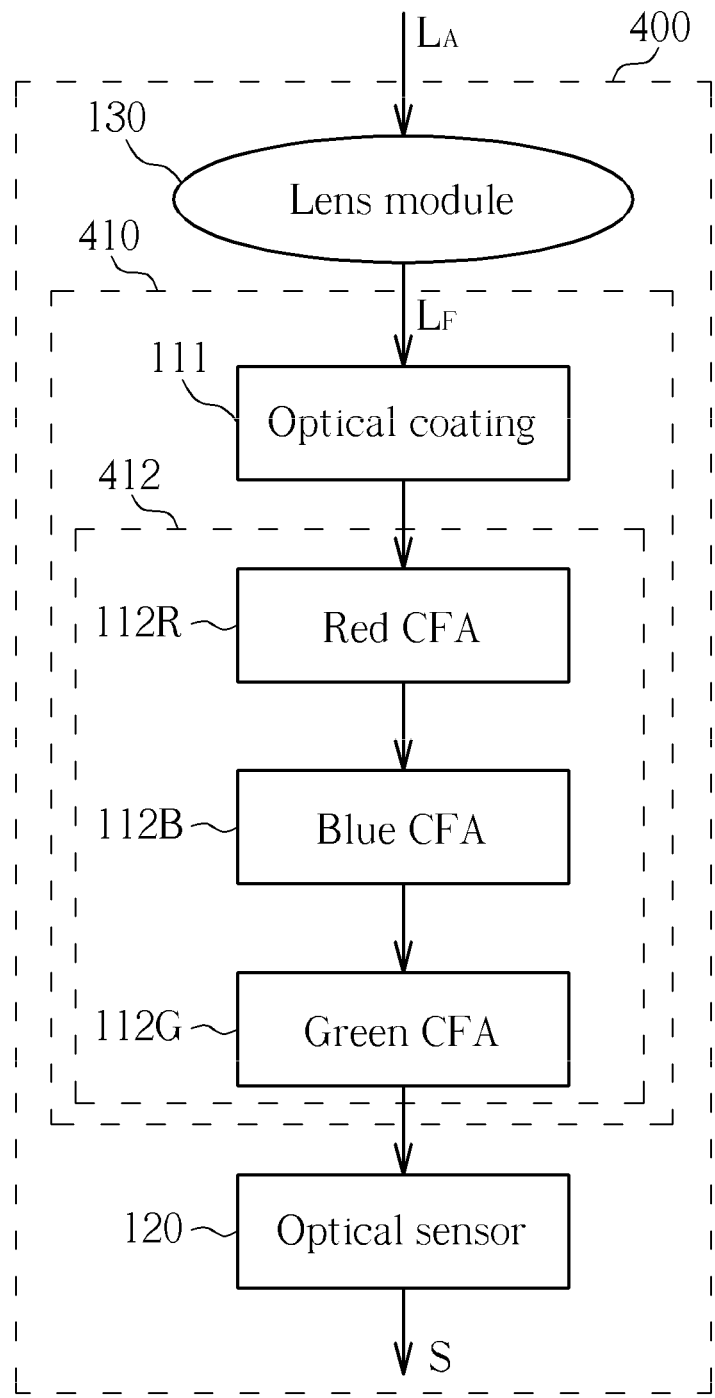
FIG. 4 is a diagram illustrating an IR sensing device according to a second embodiment of the present invention.

Please refer to FIG. 4. FIG. 4 is a diagram illustrating an IR sensing device 400 according to a second embodiment of the present invention. The IR light sensing device 400 comprises an IR pass filter 410, an optical sensor 120, and a lens module 130. The IR pass filter 410 comprises an optical coating 111, and a CFA module 412. The CFA module 412 comprises a red CFA 112R, a blue CFA 112B, and a green CFA 112G. The green CFA 112G mainly blocks light with the wavelength around 400 nm to 475 nm, and the wavelength around 600 nm to 780 nm.

Figure 5A:
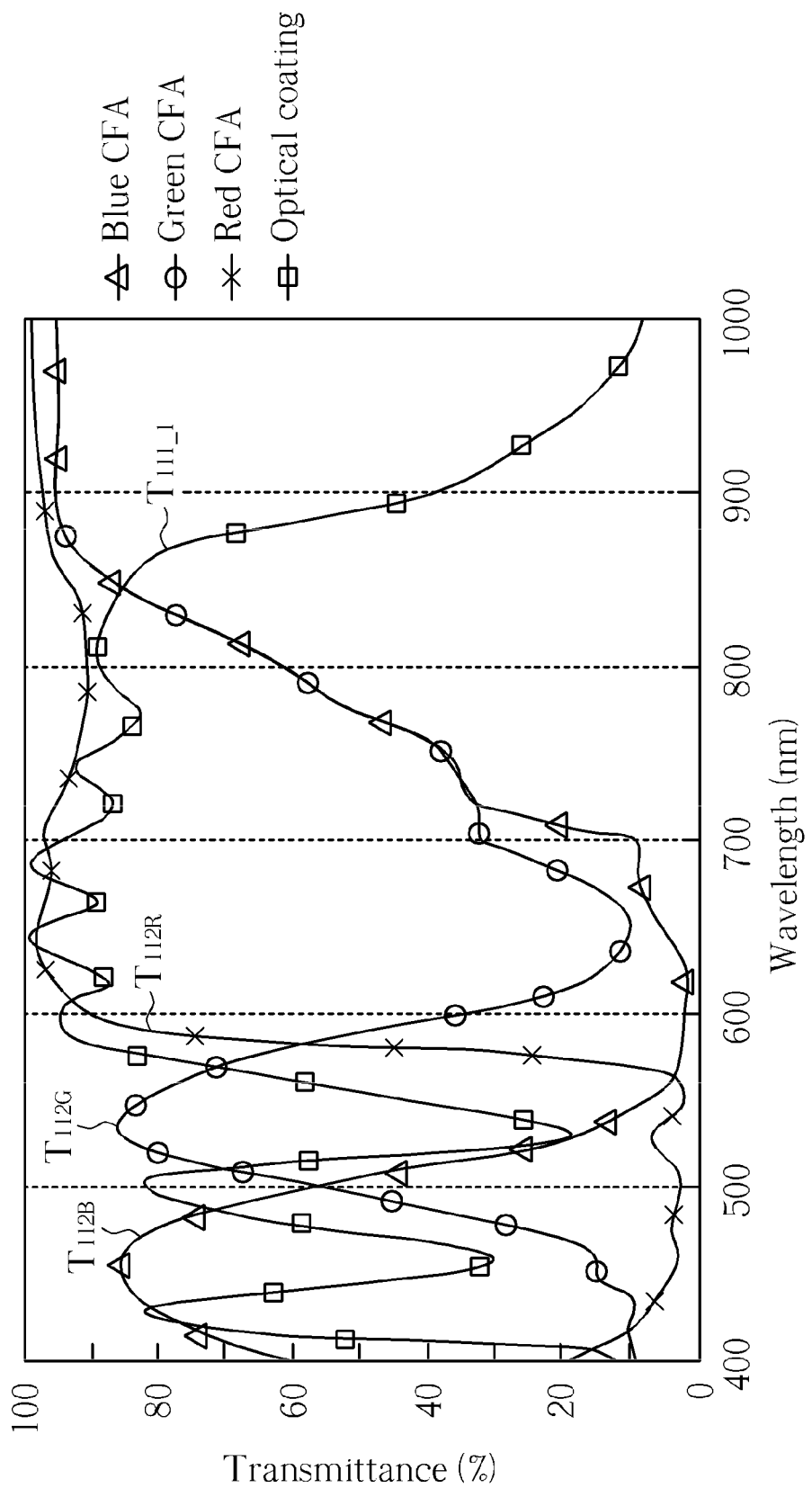
FIG. 5(a) is a diagram illustrating the transmittance spectrums respectively of the optical coating with the first setting, the red, the blue, and the green CFAs of the present invention.
Figure 5B:
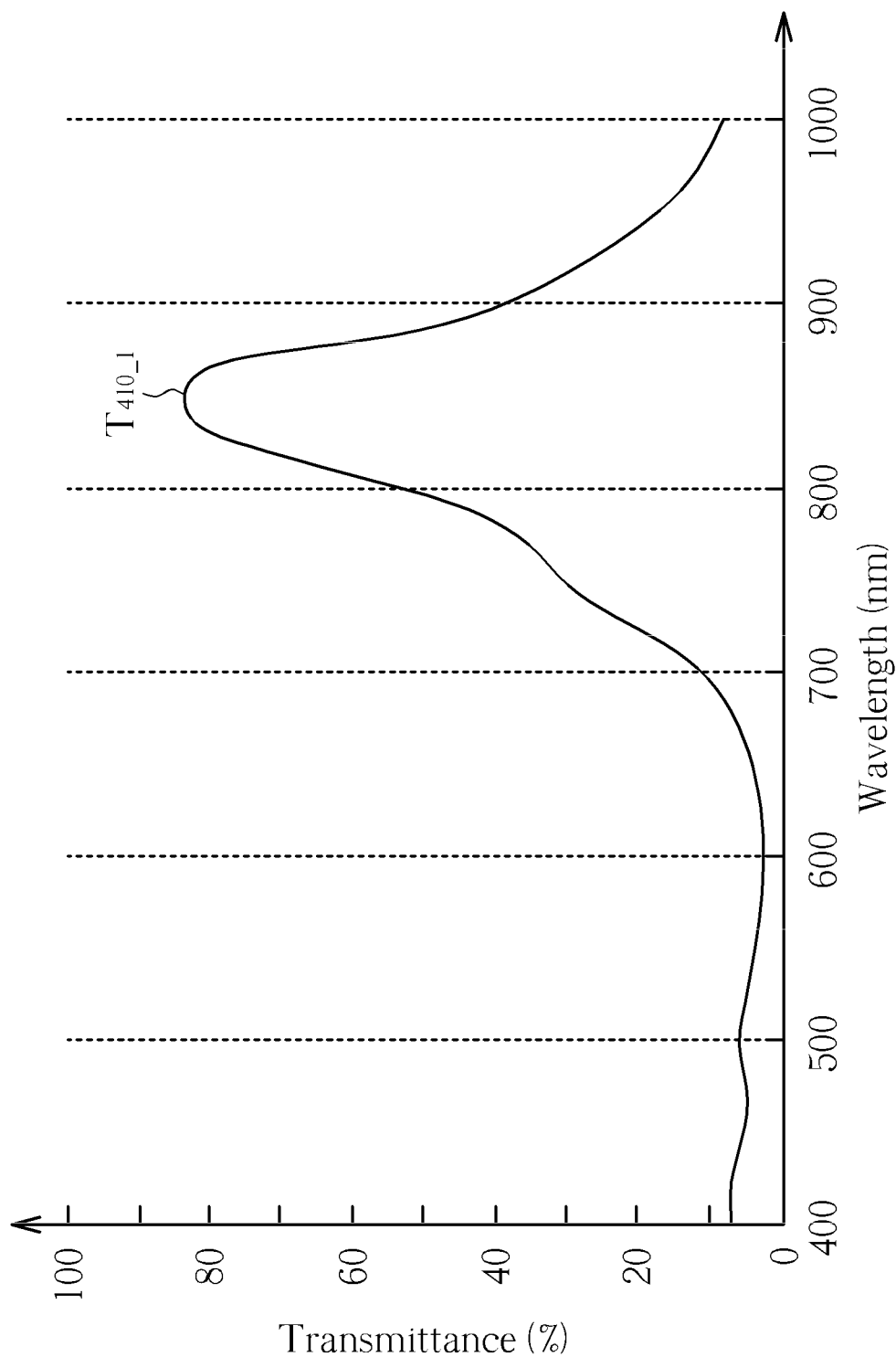
FIG. 5(b) is a diagram illustrating the resulting transmittance spectrum of the IR pass filter of the present invention from FIG. 5(a).

Please refer to FIG. 5. FIG. 5(a) is a diagram illustrating the transmittance spectrums $T_{111\_1}$, $T_{112R}$, $T_{112B}$, and $T_{112G}$ respectively of the optical coating 111 with the first setting, the red CFA 112R, the blue CFA 112B, and the green CFA 112G of the present invention. FIG. 5(b) is a diagram illustrating the resulting transmittance spectrum $T_{410\_1}$ of the IR pass filter 410 of the present invention from FIG. 5(a). In the sensitive range for the optical sensor 120, the red CFA 112R is only transparent to red light and IR; the blue CFA 112B is only transparent to blue light and IR; the green CFA 112G is only transparent to green light and IR. In the infrared range, the optical coating 111 with the first setting has a low transmittance (opaque) with a wavelength from 900 nm to 1000 nm. By combining the transmittance spectrums $T_{111\_1}$, $T_{112R}$, $T_{112B}$, and $T_{112G}$, the transmittance spectrum $T_{410\_1}$ of the IR pass filter 410 is obtained. As shown in FIG. 5(b), the IR pass filter 410 is only transparent from 780 nm to 900 nm between the sensitive range for the optical sensor 120. Therefore, the IR sensing device 400 senses the light emitted from an LED of 850 nm type.

Figure 6A:
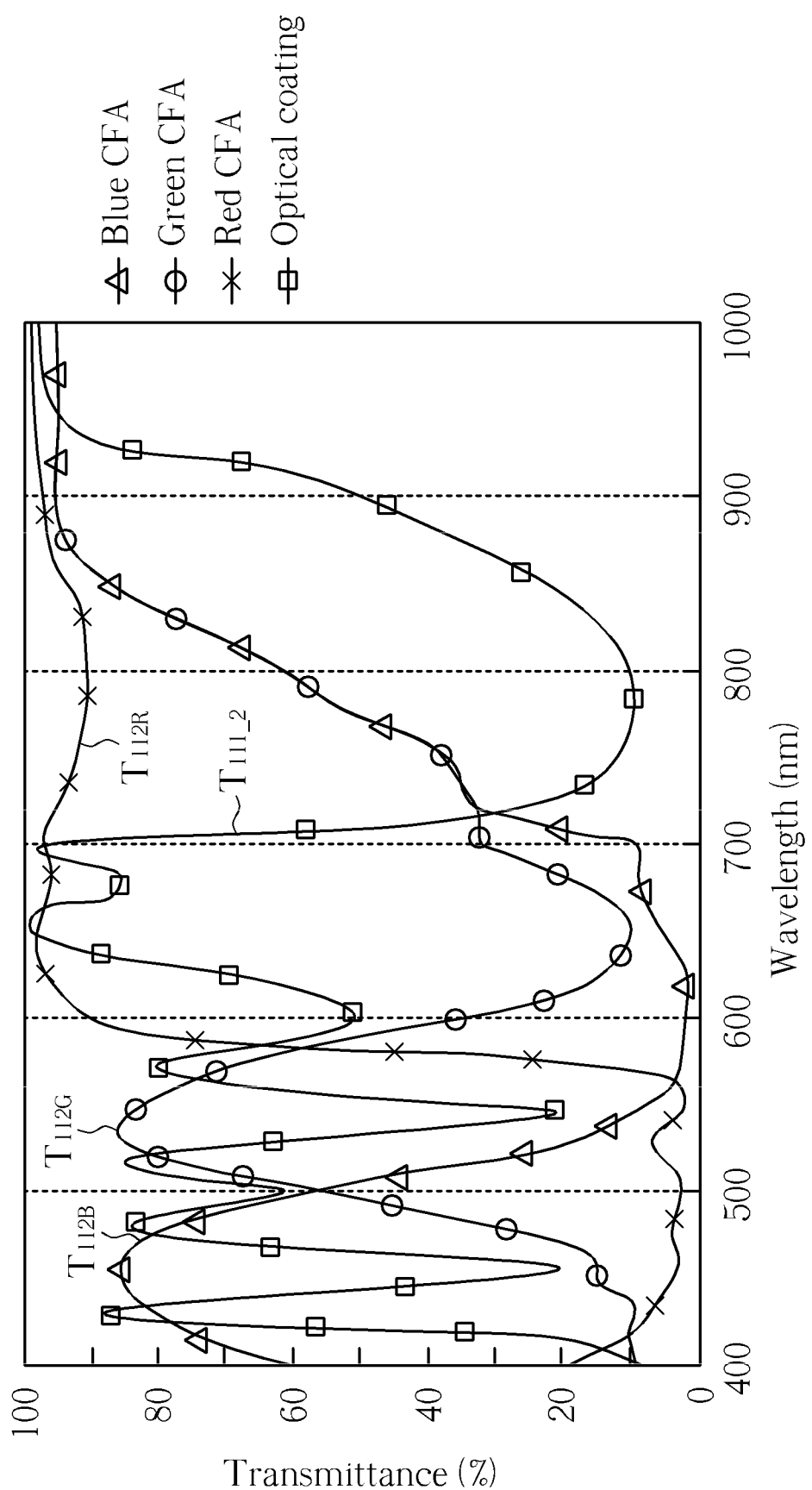
FIG. 6(a) is a diagram illustrating the transmittance spectrums respectively of the optical coating with the second setting, the red, the blue, and the green CFAs of the present invention.

Please refer to FIG. 6. FIG. 6(a) is a diagram illustrating the transmittance spectrums $T_{111\_2}$, $T_{112R}$, $T_{112B}$, and $T_{112G}$ respectively of the optical coating 111 with the second setting, the red CFA 112R, the blue CFA 112B, and the green CFA 112G of the present invention. FIG. 6(b) is a diagram illustrating the resulting transmittance spectrum $T_{410\_2}$ of the IR pass filter 410 of the present invention from FIG. 6(a). The transmittance spectrum $T_{111\_2}$ has a low transmittance with a wavelength from 750 nm to 880 nm in the infrared range. By combining the transmittance spectrums $T_{111\_2}$, $T_{112R}$, $T_{112B}$, and $T_{112G}$, the transmittance spectrum $T_{410\_2}$ of the IR pass filter 410 is obtained. As shown in FIG. 6(*b*), the IR pass filter 410 is only transparent around from 900 nm to 1000 nm between the sensitive range for the optical sensor 120. Therefore, the IR sensing device 400 senses the light emitted from an LED of 940 nm type.

Figure 7:
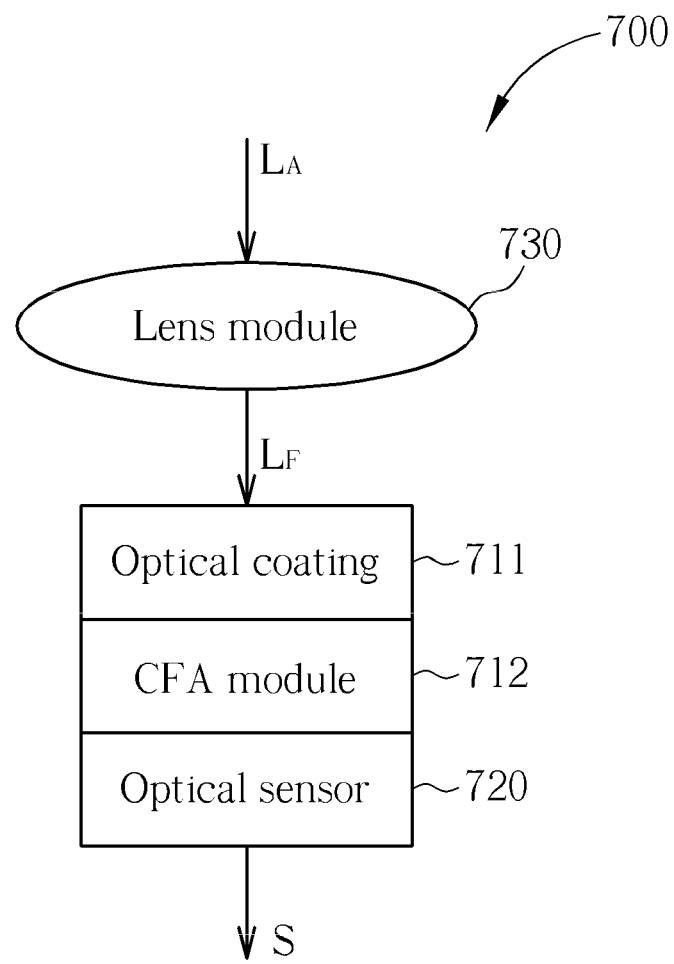
FIG. 7 is a diagram illustrating the structure view of the IR sensing device according to a third embodiment of the present invention.

Please refer to FIG. 7. FIG. 7 is a diagram illustrating the structure view of the IR sensing device 700 according to a third embodiment of the present invention. The IR sensing device 700 may be realized with the IR sensing devices 100 or 400. As shown in FIG. 7, the CFA module 712, the optical coating 711, and the optical sensor 720 can be integrated as an Integrated Chip (IC). More particularly, in the IC, the CFA module 712 is coated on the optical sensor 720, and the optical coating 711 is coated on the CFA module 712. The lens module 730 is disposed on the upside of the optical coating 711 of the IC.

Figure 8:
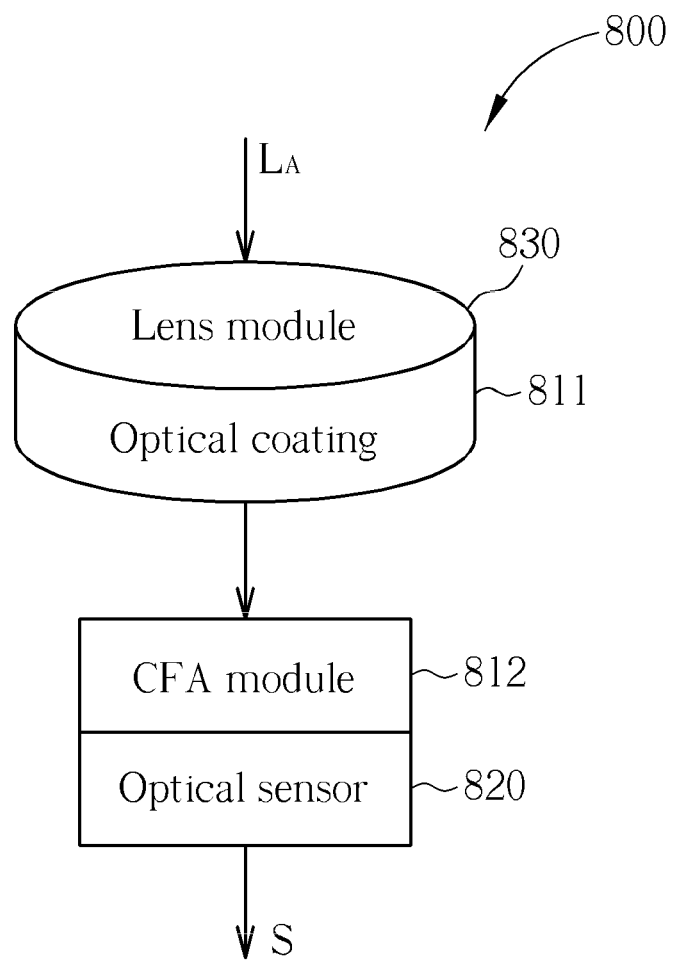
FIG. 8 is a diagram illustrating the structure view of the IR sensing device according to a fourth embodiment of the present invention.

Please refer to FIG. 8. FIG. 8 is a diagram illustrating the structure view of the IR sensing device 800 according to a fourth embodiment of the present invention. The IR sensing device 800 may be realized with the IR sensing devices 100 or 400. Comparing with FIG. 7, in FIG. 8, the CFA module 812 and the optical sensor 820 can be integrated as an IC. However, the optical coating 811 is coated on the downside of the lens module 830. The lens module 830 and the optical coating 811 are disposed on the upside of the CFA module 812 of the IC.

Figure 9:
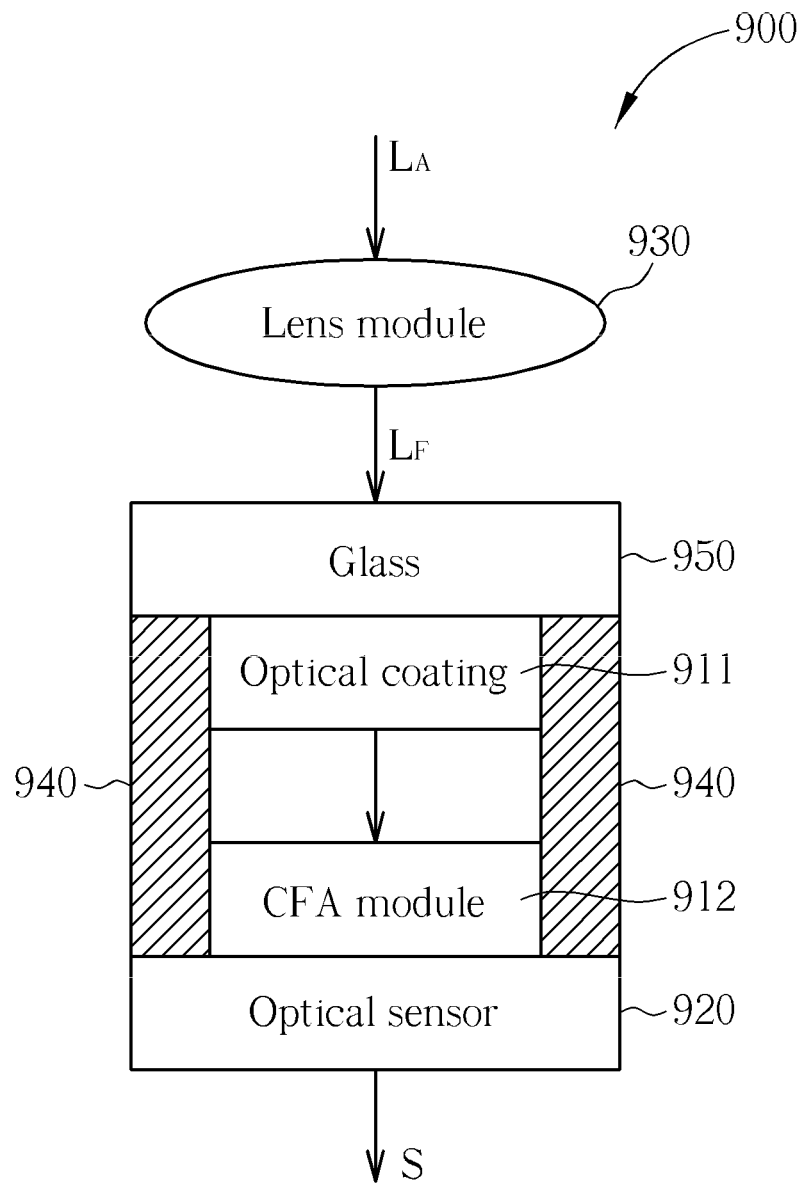
FIG. 9 is a diagram illustrating the structure view of the IR sensing device according to a fifth embodiment of the present invention.

Please refer to FIG. 9. FIG. 9 is a diagram illustrating the structure view of the IR sensing device 900 according to a fifth embodiment of the present invention. The IR sensing device 900 may be realized with the IR sensing devices 100 or 400. As shown in FIG. 9, the CFA module 912, the optical coating 911, and the optical sensor 920 can be integrated as an Integrated Chip (IC), and the package type of the IC can be Chip On Board (COB) or Chip Scale Package (CSP). In a preferred embodiment, the package type of the IC is CSP, and the CSP comprises supports 940 and a glass 950. More particularly, in the IC of the CSP type, the CFA module 912 is coated on the optical sensor 920, and the optical coating 911 is coated on the downside of the glass 950, wherein the downside faces the optical sensor 920. The lens module 930 is disposed on the upside of the glass 950 of the IC of the CSP type, wherein the upside faces the lens module 930. Furthermore, the glass 950 is coupled to the optical sensor 920 through the supports 940.

Figure 10:
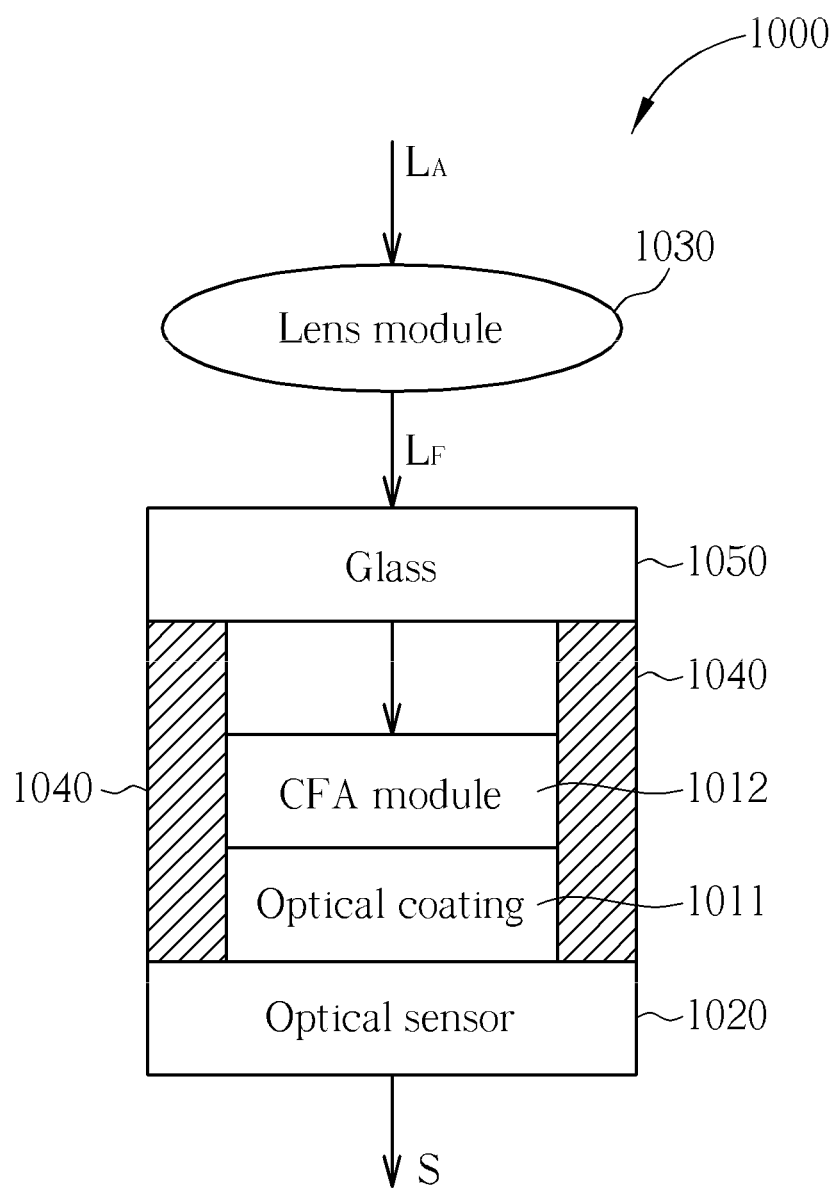
FIG. 10 is a diagram illustrating the structure view of the IR sensing device according to a sixth embodiment of the present invention.

Please refer to FIG. 10. FIG. 10 is a diagram illustrating the structure view of the IR sensing device 1000 according to a sixth embodiment of the present invention. The IR sensing device 1000 may be realized with the IR sensing devices 100 or 400. As shown in FIG. 10, the CFA module 1012, the optical coating 1011, and the optical sensor 1020 can be integrated as an Integrated Chip (IC), and the package type of the IC can be Chip On Board (COB) or Chip Scale Package (CSP). In a preferred embodiment, the package type of the IC is CSP, and the CSP comprises supports 1040 and a glass 1050. More particularly, in the IC of the CSP type, the optical coating 1011 is coated on the optical sensor 1020 and the CFA module 1012 is coated on the optical coating 1011. The lens module 1030 is disposed on the upside of the glass 1050 of the IC of the CSP type, wherein the upside faces the lens module 1030. Furthermore, the glass 1050 is coupled to the optical sensor 1020 through the supports 1040.

Figure 11:
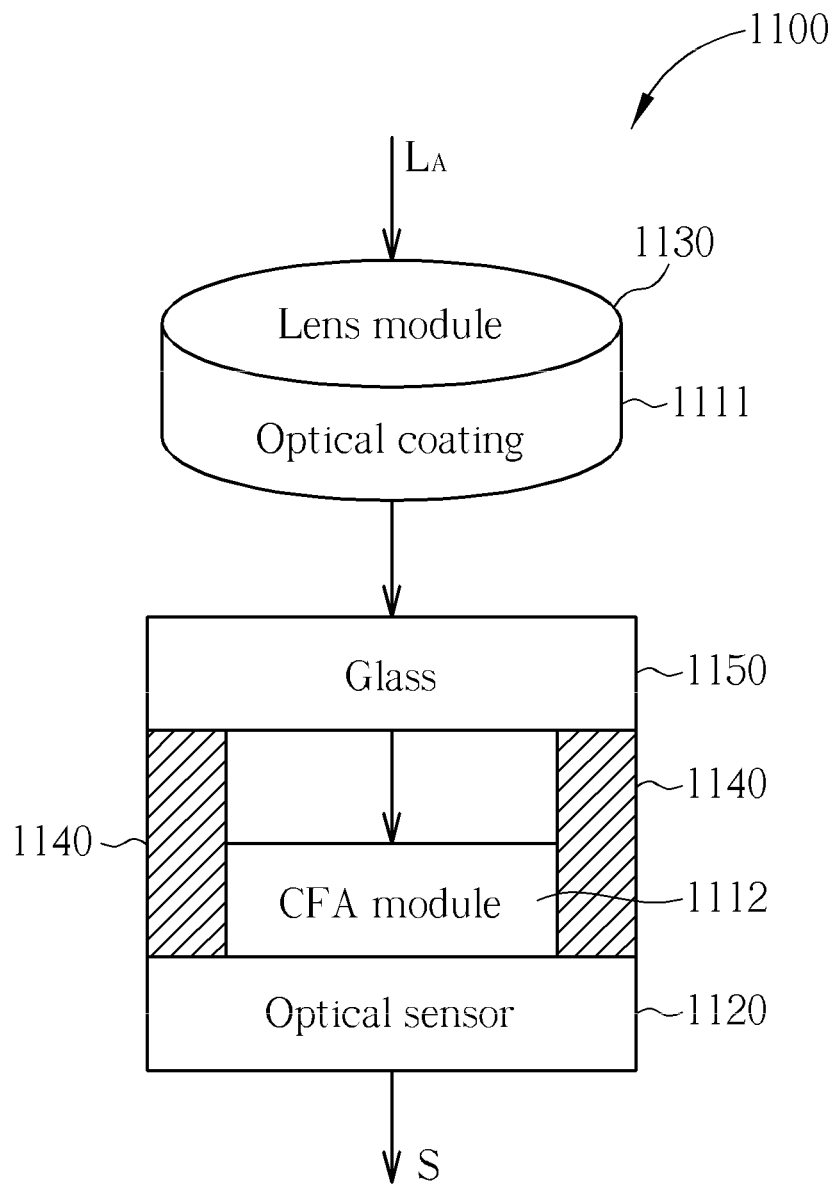
FIG. 11 is a diagram illustrating the structure view of the IR sensing device according to a seventh embodiment of the present invention.

Please refer to FIG. 11. FIG. 11 is a diagram illustrating the structure view of the IR sensing device 1100 according to a seventh embodiment of the present invention. The IR sensing device 1100 may be realized with the IR sensing devices 100 or 400. As shown in FIG. 11, the CFA module 1112 and the optical sensor 1120 can be integrated as an Integrated Chip (IC), and the package type of the IC can be Chip On Board (COB) or Chip Scale Package (CSP). In a preferred embodiment, the package type of the IC is CSP, and the CSP comprises supports 1140 and a glass 1150. More particularly, in the IC of the CSP type, the CFA module 1012 is coated on the optical sensor 1020. The optical coating 1111 is coated on the downside of the lens module 1130, which faces the glass 1150 of the IC of the CSP type. The lens module 1010 is disposed on the upside of the glass 1150 of the IC of the CSP type. Furthermore, the glass 1150 is coupled to the optical sensor 1120 through the supports 1140.

Figure 12:
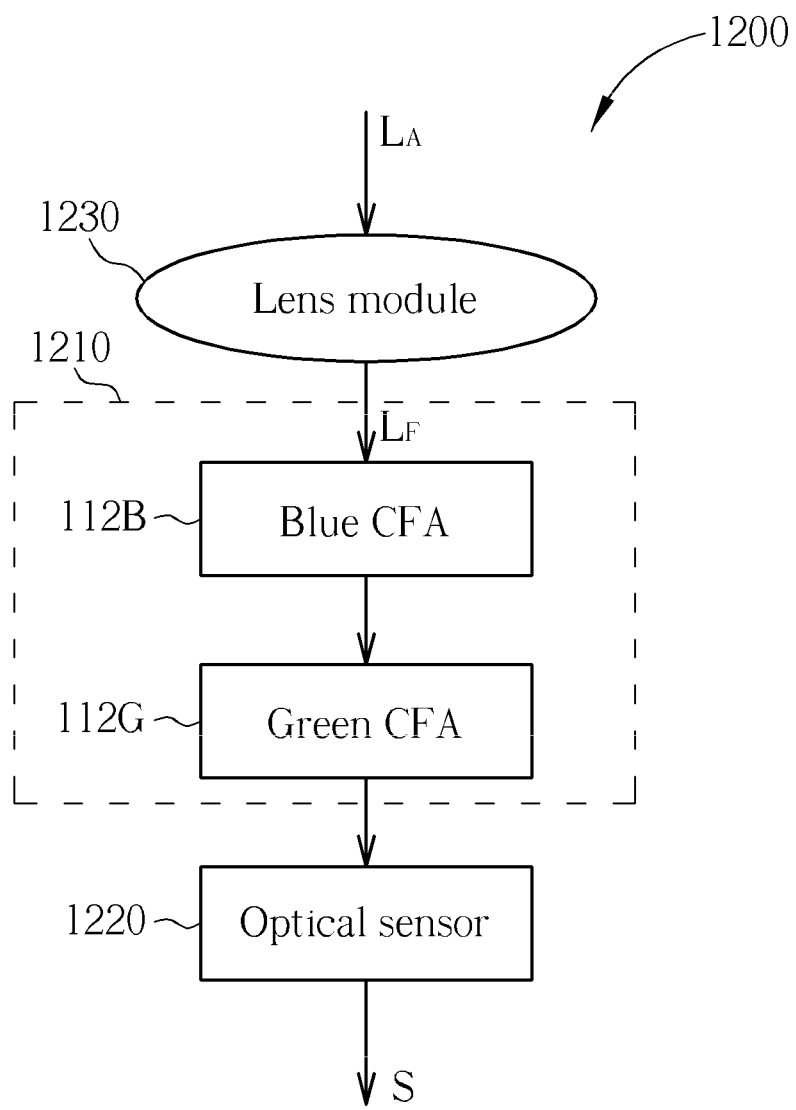
FIG. 12 is a diagram illustrating a two-band pass sensing device of the present invention.

Please refer to FIG. 12. FIG. 12 is a diagram illustrating a two-band pass sensing device 1200 of the present invention. The structures and the operational principles of the two-band pass sensing device 1200 is similar to the IR sensing devices 100 or 400 and will not be repeated again for brevity. The difference is that the two-band pass filter 1210 comprises a blue CFA 112B and a green CFA 112G.

Figure 13A:
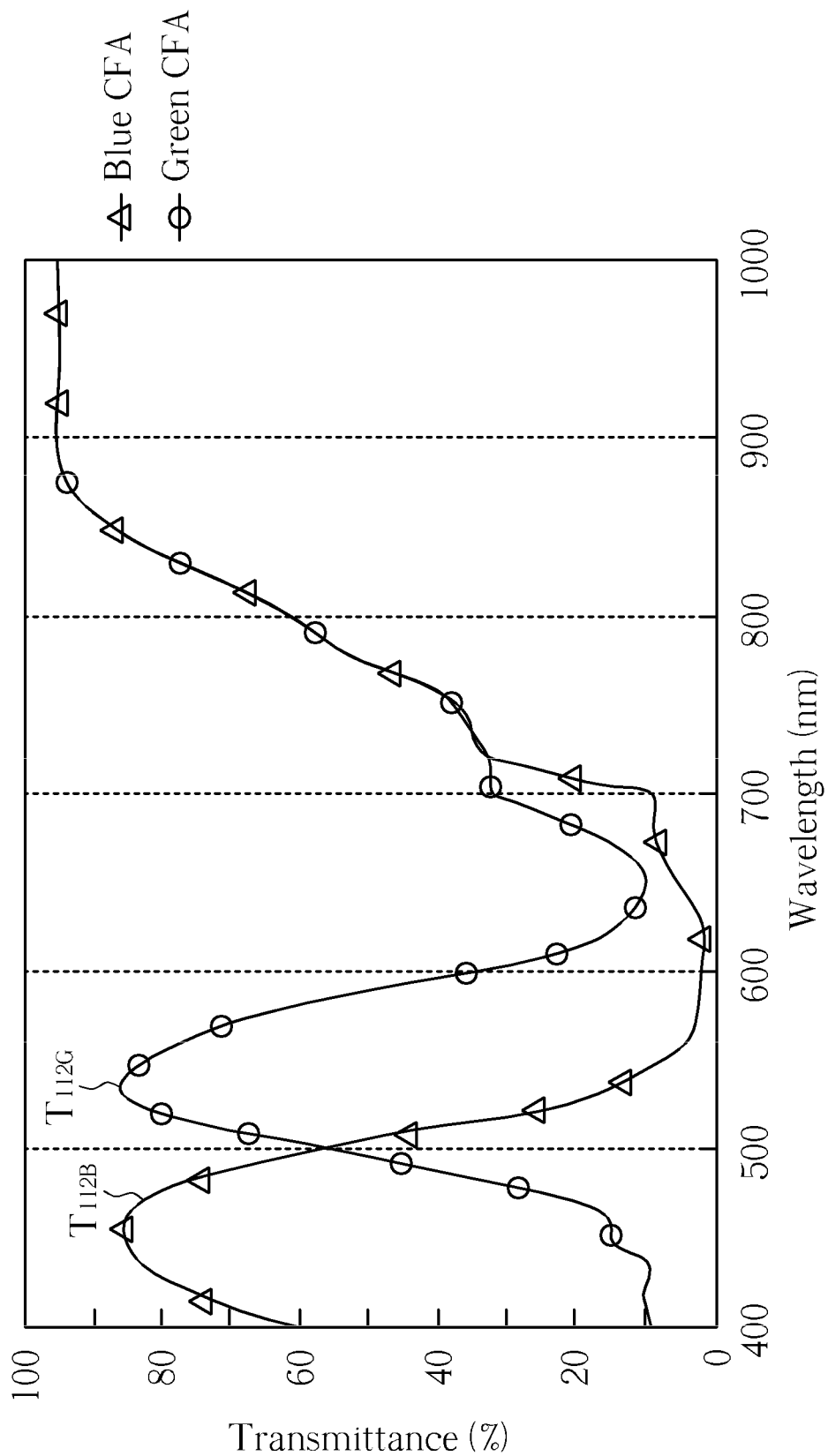
FIG. 13(a) is a diagram illustrating the transmittance spectrums respectively of the blue and the green CFAs of the two-band pass filter of the two-band pass sensing device of the present invention.
Figure 13B:
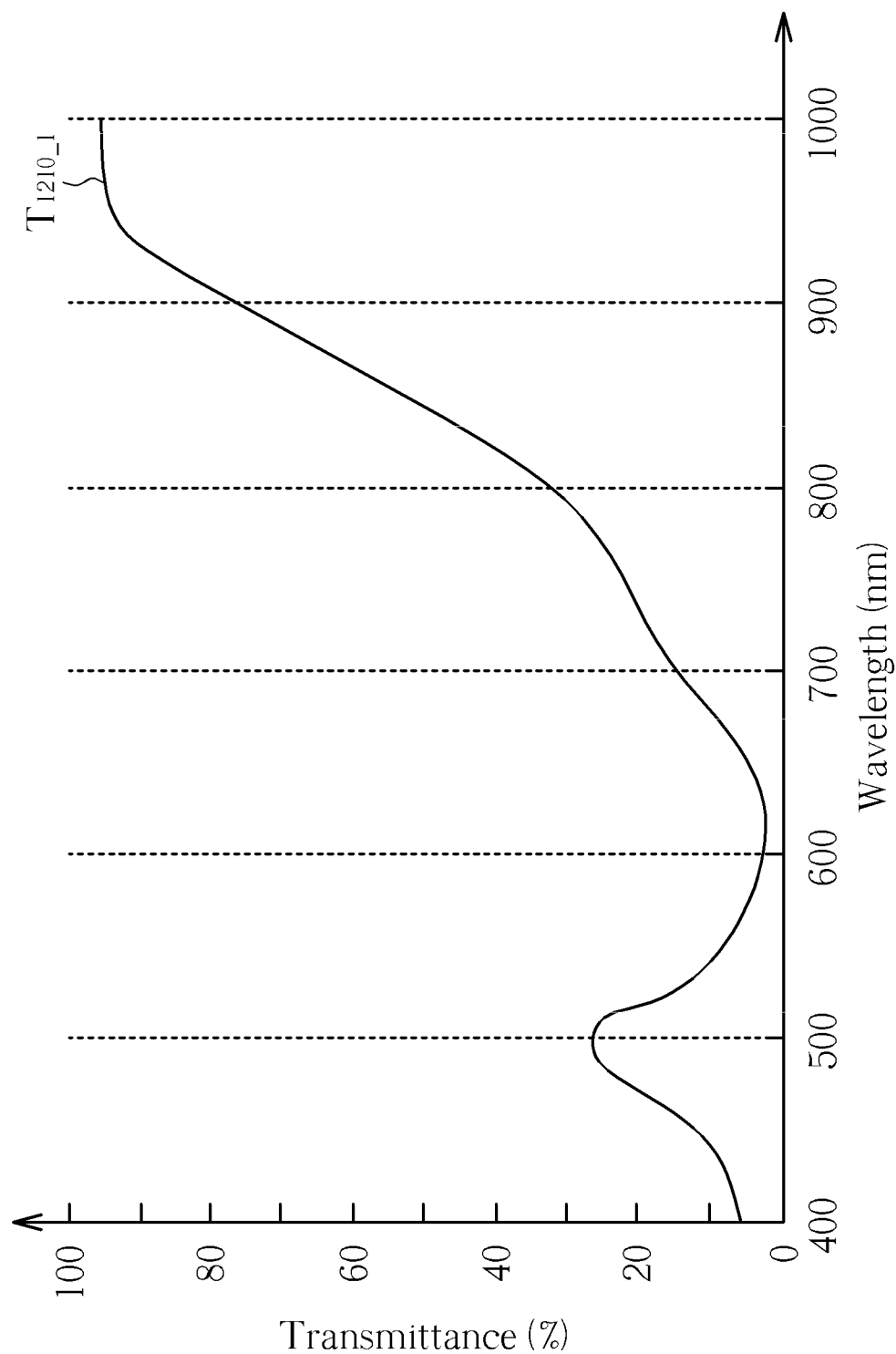
FIG. 13(b) is a diagram illustrating the resulting transmittance spectrum of the two-band pass filter of the two-band pass sensing device of the present invention from FIG. 13(a).

Please refer to FIG. 13. FIG. 13(*a*) is a diagram illustrating the transmittance spectrums $T_{112B}$, and $T_{112G}$ respectively of the blue CFA 112B, and the green CFA 112G of the two-band pass filter 1210 of the two-band pass sensing device 1200 of the present invention. FIG. 13(*b*) is a diagram illustrating the resulting transmittance spectrum $T_{1210\_1}$ of the two-band pass filter 1210 of the two-band pass sensing device 1200 of the present invention from FIG. 13(*a*) the green CFA 112G is only transparent to green light and IR, and the blue CFA 112B is only transparent to blue light and IR. However, combining the transmittance spectrums $T_{112B}$ and $T_{112G}$, the two-band pass filter 1210 is not only transparent to IR (800 nm to 1000 nm), but also a little transparent to the light with the wavelength around 500 nm, as shown in FIG. 13. Therefore, by means of the two-band pass filter 1210, the two-band pass sensing device 1200 not only senses the IR, but also senses the light with the wavelength around 500 nm.

To sum up, the present invention mainly provides an IR sensing device with the IR pass filter realized with both CFAs and the optical coating. With the help of the CFAs, the range of the wavelength that the optical coating has to block becomes smaller, which greatly reduces the required number of layers of the optical coating. Since the number of the layers of the CFAs is smaller, and the number of the layers of the optical coating becomes small, the number of the overall layers of the IR pass filter of the IR sensing device of the present invention can be greatly reduced. Furthermore, the CFAs are easily integrated with the optical sensor, which reduces cost for the IR sensing device of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An Infrared Radiation (IR) sensing device, an optical path existing for an ambient light to enter the IR sensing device, the IR sensing device comprising:
   an IR pass filter, comprising:
   an optical coating, disposed on the optical path, for blocking light with wavelength around a predetermined range; and
   a Color Filter Array (CFA) module, disposed on the optical path before or after the optical path passing through the optical coating, for blocking light with wavelength around 400 nm to 780 nm; and an optical sensor for absorbing photons of light after being blocked by the IR pass filter on the optical path and accordingly generating an electrical signal.

2. The IR sensing device of claim 1, wherein the optical coating comprises:
N high refractive index layers; and
M low refractive index layers;
wherein the N high refractive index layers and the M low refractive index layers are interlacingly stacked;
wherein N represents an integer;
wherein M represents an integer.

3. The IR sensing device of claim 2, wherein the high refractive index layers are $TiO_2$, and the low refractive index layers are $SiO_2$ or $MgF_2$.

4. The IR sensing device of claim 1, wherein sensitive range of the optical sensor is from 400 nm to 1000 nm.

5. The IR sensing device of claim 4, wherein the CFA module comprises:
a red CFA for passing red light; and
a blue CFA for passing blue light.

6. The IR sensing device of claim 5, wherein the red CFA blocks light with wavelength around 400 nm to 570 nm; the blue CFA blocks light with wavelength around 520 nm to 780 nm.

7. The IR sensing device of claim 6, wherein the predetermined range is around 900 nm to 1000 nm.

8. The IR sensing device of claim 7, wherein the optical sensor absorbs photons of light with wavelength around 780 nm to 900 nm.

9. The IR sensing device of claim 6, wherein the predetermined range is around 750 nm to 880 nm.

10. The IR sensing device of claim 9, wherein the optical sensor absorbs photons of light with wavelength around 900 nm to 1000 nm.

11. The IR sensing device of claim 5, wherein the CFA module further comprises:
a green CFA for passing green light.

12. The IR sensing device of claim 11, wherein the green CFA blocks light with wavelength around 400 nm to 475 nm and around 600 nm to 780 nm.

13. The IR sensing device of claim 1, wherein the optical coating, the CFA module, and the optical sensor are packaged into an Integrated Chip (IC).

14. The IR sensing device of claim 1, wherein the CFA module is coated on the optical sensor, and the optical coating is coated on the lens module.

15. The IR sensing device of claim 1, wherein the optical coating, the CFA module, and the optical sensor are packaged into an IC of Chip Scale Package (CSP) type, and the IC of CSP type comprises a glass and supports.

16. The IR sensing device of claim 15, wherein the optical coating is coated on a first side of the glass, the CFA module is coated on the optical sensor, and the supports are coupled between the first side of the glass and the optical sensor; the first side of the glass faces the optical sensor, and a second side of the glass faces the lens module.

17. The IR sensing device of claim 15, wherein the optical coating is coated on the optical sensor, the CFA module is coated on the optical coating, and the supports are coupled between a first side of the glass and the optical sensor; the first side of the glass faces the optical sensor, and a second side of the glass faces the lens module.

18. The IR sensing device of claim 1, wherein the CFA module and the optical sensor are packaged into an IC of CSP type, and the IC of CSP type comprises a glass and supports.

19. The IR sensing device of claim 18, wherein the CFA module is coated on the optical sensor, the optical coating is coated on the lens module, and the supports are coupled between a first side of the glass and the optical sensor; the first side of the glass faces the optical sensor, and a second side of the glass faces the lens module.

20. The two-band pass sensing device of claim 19, wherein the blue CFA blocks light with wavelength around 520 nm to 780 nm; the green CFA blocks light with wavelength around 400 nm to 475 nm and around 600 nm to 780 nm.

21. The IR sensing device of claim 1 further comprising a lens module disposed on the optical path, for focusing light on the optical path.

22. A two-band pass sensing device, an optical path existing for an ambient light to enter the two-band pass sensing device, the two-band pass sensing device comprising:
a two band-pass filter, comprising:
a CFA module, disposed on the optical path, the CFA module comprising:
a blue CFA for passing blue light; and
a green CFA for passing green light; and
an optical sensor for absorbing photons of light after being blocked by the blue CFA and the green CFA of the two band-pass filter on the optical path in a sequential manner and accordingly generating an electrical signal.

23. The two-band pass sensing device of claim 22, wherein the optical sensor absorbs photons of light with wavelength around 800 nm to 1000 nm and 500 nm.

24. The two-band pass sensing device of claim 22, wherein sensitive range of the optical sensor is from 400 nm to 1000 nm.

25. The two-band pass sensing device of claim 22 further comprising a lens module disposed on the optical path, for focusing light on the optical path.

* * * * *